(12) United States Patent
Manohar et al.

(10) Patent No.: US 10,979,037 B2
(45) Date of Patent: Apr. 13, 2021

(54) REVERSE CURRENT PROTECTION CIRCUIT

(71) Applicant: TEXAS INSTRUMENTS INCORPORATED, Dallas, TX (US)

(72) Inventors: Sujan Kundapur Manohar, Dallas, TX (US); Roland Karl Son, Dallas, TX (US); Juergen Luebbe, Fairview, TX (US); Eddie W. Yu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 169 days.

(21) Appl. No.: 16/167,151

(22) Filed: Oct. 22, 2018

(65) Prior Publication Data

US 2019/0058463 A1 Feb. 21, 2019

Related U.S. Application Data

(63) Continuation of application No. 15/232,521, filed on Aug. 9, 2016, now Pat. No. 10,116,291.
(Continued)

(51) Int. Cl.
*H02H 3/087* (2006.01)
*H03K 5/08* (2006.01)
*H03K 17/0812* (2006.01)
*H02H 3/18* (2006.01)
*H02H 3/08* (2006.01)
*H03K 17/082* (2006.01)
(Continued)

(52) U.S. Cl.
CPC ............... *H03K 5/08* (2013.01); *H02H 3/18* (2013.01); *H03K 17/08122* (2013.01); *H02H 3/08* (2013.01); *H02H 3/087* (2013.01); *H02H 3/44* (2013.01); *H02H 9/02* (2013.01); *H02H 9/025* (2013.01); *H03K 17/0822* (2013.01)

(58) Field of Classification Search
USPC .............................. 361/84, 86–87, 93.7–93.9
See application file for complete search history.

(56) References Cited

U.S. PATENT DOCUMENTS

| | | | |
|---|---|---|---|
| 8,174,209 | B2 | 5/2012 | Bayer et al. |
| 2012/0056592 | A1 | 3/2012 | Sakurai et al. |
| 2014/0257632 | A1 | 9/2014 | Kanzaki et al. |

FOREIGN PATENT DOCUMENTS

KR  20010000060 A  1/2001

OTHER PUBLICATIONS

International Search Report for PCT/US2016/046349 dated Nov. 17, 2016.

*Primary Examiner* — Danny Nguyen
(74) *Attorney, Agent, or Firm* — Valerie M. Davis; Charles A. Brill; Frank D. Cimino

(57) ABSTRACT

In described examples, a power interface subsystem includes power transistors, each having: a conduction path coupled between a battery terminal and an accessory terminal; and a control terminal. A differential amplifier has: a first input coupled to the battery terminal; a second input coupled to the accessory terminal; and an output node. An offset voltage source is coupled to cause an offset of a selected polarity at one of the inputs to the differential amplifier. The offset has a first polarity in a first operating mode and a second polarity in a second operating mode. Gate control circuitry is coupled to apply a control level at the control terminal(s) of selected one(s) of the power transistors responsive to a voltage at the output node, and to apply an off-state control level to the control terminal(s) of unselected one(s) of the power transistors.

20 Claims, 7 Drawing Sheets

Related U.S. Application Data

(60) Provisional application No. 62/203,288, filed on Aug. 10, 2015.

(51) Int. Cl.
*H02H 9/02* (2006.01)
*H02H 3/44* (2006.01)

FIG. 5

REVERSE CURRENT PROTECTION CIRCUIT

CROSS-REFERENCE TO RELATED APPLICATIONS

This application is a continuation of U.S. patent application Ser. No. 15/232,521 filed Aug. 9, 2016, which claims priority to U.S. Provisional Patent Application Ser. No. 62/203,288 filed Aug. 10, 2015, the entireties of which are incorporated herein by reference.

BACKGROUND

This relates generally to semiconductor integrated circuits, and more particularly to protection circuitry in an electronic system, deployed at interfaces of the system to external devices.

Advances in the electronics industry have provided various types of modern portable, battery-powered electronic systems and devices. Some of these systems, such as smartphones, tablet devices, e-readers and ultra-portable computers (i.e., "subnotebook" computers), have interfaces that may be connected to external accessory devices that provide various peripheral functions. Such accessories include: external storage devices (e.g., solid-state disk storage); input and output devices, such as printers, keyboards, cameras and gaming controllers; power sources; and communications devices or functions, among others. Often, these accessories connect to the system via standard interfaces and connectors, such as those compliant with the Universal Serial Bus (USB) standard, but in some cases connect via proprietary or other interfaces that are specific to a manufacturer or device type. In any case, as user demand for these portable systems and devices and the ability to access content using these devices continues to increase, so does the demand for improved performance, capability and convenience in the connectivity technologies for coupling accessories to portable electronic systems.

Power considerations are important in the interface between a battery-powered system and an accessory. These considerations are complicated for those interfaces, such as USB Type-C interfaces, which can connect to a wide variety of accessories, particularly where some accessories are powered by the system and thus receive power from the system battery, while others can provide power to the system and can thus charge the battery. In these types of interfaces, it is important to protect the circuitry of the system against excessive reverse current from the accessory, and for those devices that are not intended to charge the battery to block reverse current entirely.

FIG. 1 illustrates a conventional power interface subsystem, such as may be implemented at an accessory interface (e.g., USB) of a smartphone or other portable system powered by battery 2. Battery 2 is capable of powering an accessory via a power connection at terminal ACC_PWR, and/or be charged itself from certain power accessories coupled at terminal ACC_PWR. For example, in modern smartphones, battery 2 is typically a lithium-ion battery, which presents a voltage $V_{BAT}$ at terminal BAT that can range from 6 volts (when fully charged) to below 2.5 volts (when approaching full discharge). Conversely, the accessory to which the smartphone is connected may present a voltage $V_{ACC\_PWR}$ as high as 20 volts at terminal ACC_PWR. In this conventional power interface subsystem, the current path between terminals BAT and ACC_PWR is controlled by high-voltage n-channel power MOSFET transistors 4HV, 8HV, in response to gate voltages GATE_SNS_CTRL and GATE_PASS_CTRL, respectively, from reverse current protection circuit 10 and current sense and limiter circuit 12. As indicated by their symbols in FIG. 1, transistors 4HV, 8HV are constructed as high-voltage transistors, such as lateral double-diffused MOS transistors (DMOS, or LDMOS), considering the potential for high voltages and currents between terminals BAT and ACC_PWR in this application. Pull-up current sources maintain bias currents $I_{PU}$ at the gates of transistors 4HV, 8HV, as shown in FIG. 1; these current sources may also be controlled by gate voltages GATE_SNS_CTRL and GATE_PASS_CTRL to be deselected when their respective transistors 4HV, 8HV are deselected.

Current sense and limiter circuit 12 operates essentially as a comparator, comparing the voltage at terminal BAT with the voltage at node PMID at the drains of transistors 4HV, 8HV, via the source/drain path of n-channel high voltage MOS transistor 6HV when turned on by gate voltage GATE_SNS_CTRL from reverse current protection circuit 10. In operation, current sense and limiter circuit 12 senses the polarity and magnitude of the voltage across transistor 4HV between terminal BAT and node PMID, which reflects the polarity and magnitude of current flow between terminals BAT and ACC_PWR. A replica of this current is provided by current sense and limiter circuit 12 to an analog-to-digital converter (ADC) (not shown) for use in overall system control. In the event of a short circuit at terminal ACC_PWR, current sense and limiter 12 protects the power interface circuitry by de-asserting gate voltage GATE_PASS_CTRL to turn off transistor 8HV.

In contrast, reverse current protection circuit 10 protects against excessive reverse current from an accessory coupled to terminal ACC_PWR and battery 2. As shown in FIG. 1, reverse current protection circuit 10 is constructed as a differential amplifier, with two input legs coupled across terminals ACC_PWR and BAT and output circuitry that applies gate voltage GATE_SNS_CTRL to the gate of transistor 4HV and that issues a status signal FLAG to the appropriate processor in the integrated circuit in response to the comparison of the voltages $V_{BAT}$ and $V_{ACC\_PWR}$. In this conventional architecture, reverse current protection circuit 10 operates in either of two modes, which are: a comparator mode in which transistor 4HV is blocked (signal GATE_SNS_CTRL driven fully to ground) if the voltage $V_{ACC\_PWR}$ exceeds voltage $V_{BAT}$ by more than a reverse voltage limit, and an ideal diode mode in which the forward voltage between battery 2 and the attached accessory is regulated.

FIG. 2 is an electrical schematic of a conventional construction of reverse current protection circuit 10. In the first input leg, voltage $V_A$ is developed at a node between resistor $R_1$ and diode $11_A$ from voltage $V_{BAT}$, while a voltage $V_B$ is developed in the second input leg at a node between resistor $R_1$ and diode $11_B$ from the sum of voltage $V_{ACC\_PWR}$ and a voltage $\pm V_{REV}$ from offset voltage source 20. Offset voltage source 20 is typically constructed to conduct a trimmable current from either of the input legs, which is reflected as an offset $\pm V_{REV}$ in the voltage across resistor $R_1$. The polarity of voltage $V_{REV}$ depends on a mode signal MODE that indicates whether reverse current protection circuit 10 is in the ideal diode mode or in the comparator mode; the polarity of voltage $+V_{REV}$ shown in FIG. 1 corresponds to the diode mode. Diodes $D_1$, $D_2$ are connected across the two legs to limit the differential voltage $\Delta V = |V_A - V_B|$ to at most a diode drop. P-channel MOS input transistor $13_A$ in the $V_A$ input leg has its source receiving voltage $V_A$ via diode $11_A$, and has its gate connected to its drain and to the gate of p-channel MOS input transistor $13_B$ in the $V_B$ input leg. Transistor $13_B$ has its source receiving voltage $V_B$ via diode $11_B$. High voltage p-channel MOS transistors $15HV_A$, $15HV_B$ in the two input legs are similarly configured as transistors $13_A$, $13_B$. The combination of input transistors $13_A$, $13_B$ and high-voltage input transistors $15_A$, $15_B$ establishes differential currents in the two legs in response to the differential voltage $\Delta V$. In this conventional arrangement, transistors $15HV_A$, $15HV_B$ are constructed as high-voltage transistors, such as lateral double-diffused MOS transistors (DMOS, or LDMOS), to protect the rest of reverse current protection circuit 10 against a possible extreme voltage (e.g., on the order of 20 volts) at terminal ACC_PWR.

Enable transistors $16HV_A$, $16HV_B$ in the two input legs are n-channel MOS transistors that receive a control signal ENABLE at their gates, allowing reverse current protection circuit 10 to be selectively enabled by control circuitry elsewhere in the integrated circuit. N-channel MOS transistors $17HV_A$, $17HV_B$, which are typically scaled relative to one another to define the range of the output signal, have their source/drain paths connected between the respective input legs and ground, and their gates controlled by voltage reference 21, forming an active load in the differential amplifier. Output voltage $V_{AOUT}$, at the drain of transistor $17HV_B$, reflects the differential voltage $\Delta V$, and is applied to an amplifier of n-channel MOS transistor 19HV (biased by current $I_{PU}$ from a regulated voltage VCP), which produces gate voltage GATE_SNS_CTRL at its drain. High-voltage n-channel MOS transistor 22 also receives voltage $V_{AOUT}$ at its gate, and drives logic signal FLAG from its drain voltage via comparator 24.

In the ideal diode operating mode, offset voltage source 20 pulls current from the $V_A$ node to cause an offset between voltages $V_A$ and $V_B$ such that circuit 10 compares voltage $V_A = V_{BAT} - V_{REV}$ with the voltage $V_B = V_{ACC\_PWR}$. In this mode, circuit 10 regulates the forward voltage from terminal BAT to terminal ACC_PWR to ensure the voltage relationship of $V_{ACC\_PWR} \leq (V_{BAT} - V_{REV})$. If the voltage $V_{ACC\_PWR}$ rises too high (i.e., above the voltage $V_{BAT} - V_{REV}$) in this ideal diode mode, then voltage $V_{AOUT}$ will slew to a higher voltage, turning on transistor 19HV, throttling down the gate voltage GATE_SNS_CTRL, and increasing the on-state resistance of power transistor 4HV. Accordingly, reverse current protection circuit 10 regulates gate voltage GATE_SNS_CTRL at the gate of power transistor 4HV to maintain a forward voltage $+V_{REV}$ from terminal BAT to terminal ACC_PWR, blocking reverse current $I_{REV}$ from terminal ACC_PWR toward battery 2. By operating in this ideal diode mode, two low frequency poles exist in the frequency response of reverse current protection circuit 10, with a dominant pole at the gate of power transistor 4HV, a first non-dominant pole caused by the large output capacitance $C_{OUT}$ at terminal ACC_PWR, and a second non-dominant pole appearing at the gate of transistor 19HV (i.e., voltage $V_{AOUT}$). In this conventional architecture, diode-connected high voltage n-channel MOS transistor 18HV is connected at the gate of amplifier transistor 19HV to push that second non-dominant pole to a higher frequency.

In its comparator mode, reverse current protection circuit 10 permits a controlled reverse current $I_{REV}$ to charge battery 2 from the accessory connected at terminal ACC_PWR. In this mode, offset voltage source 20 pulls current from the $V_B$ node to cause an offset between voltages $V_A$ and $V_B$ such that voltage $V_A = V_{BAT} + V_{REV}$ is compared with the voltage $V_B = V_{ACC\_PWR}$. Circuit 10 thus regulates a negative polarity offset voltage $-V_{REV}$ at terminal BAT relative to terminal ACC_PWR, allowing voltage $V_{ACC\_PWR}$ to exceed voltage $V_{BAT}$ by no more than this reverse voltage $|V_{REV}|$. Reverse current protection circuit 10 controls the magnitude of the corresponding reverse current $I_{REV}$ by effectively sensing the voltage across the series on-state resistances of transistors 4HV and 6HV, and controlling gate voltage GATE_SNS_CTRL of transistor 4HV in response. If the reverse current $I_{REV}$ from terminal ACC_PWR increases, so that the voltage across the series source/drain paths of transistors 4HV and 6HV exceeds reverse voltage $V_{REV}$, then voltage $V_{AOUT}$ will slew high, turning on transistor 19HV and pulling gate voltage GATE_SNS_CTRL to ground to fully turn off transistor 4HV. As a result, logic signal FLAG is asserted to indicate this condition.

SUMMARY

In described examples, a power interface subsystem includes power transistors, each having: a conduction path coupled between a battery terminal and an accessory terminal; and a control terminal. A differential amplifier has: a first input coupled to the battery terminal; a second input coupled to the accessory terminal; and an output node. An offset voltage source is coupled to cause an offset of a selected polarity at the inputs to the differential amplifier. The offset has a first polarity in a first operating mode and a second polarity in a second operating mode. Gate control circuitry is coupled to apply a control level at the control terminal(s) of selected one(s) of the power transistors responsive to a voltage at the output node, and to apply an off-state control level to the control terminal(s) of unselected one(s) of the power transistors.

BRIEF DESCRIPTION OF THE DRAWINGS

FIG. 5 is an electrical diagram, in schematic form, of a reverse current protection circuit in the power interface subsystem of FIG. 3, according to an embodiment.

DETAILED DESCRIPTION OF EXAMPLE EMBODIMENTS

Figure 1:
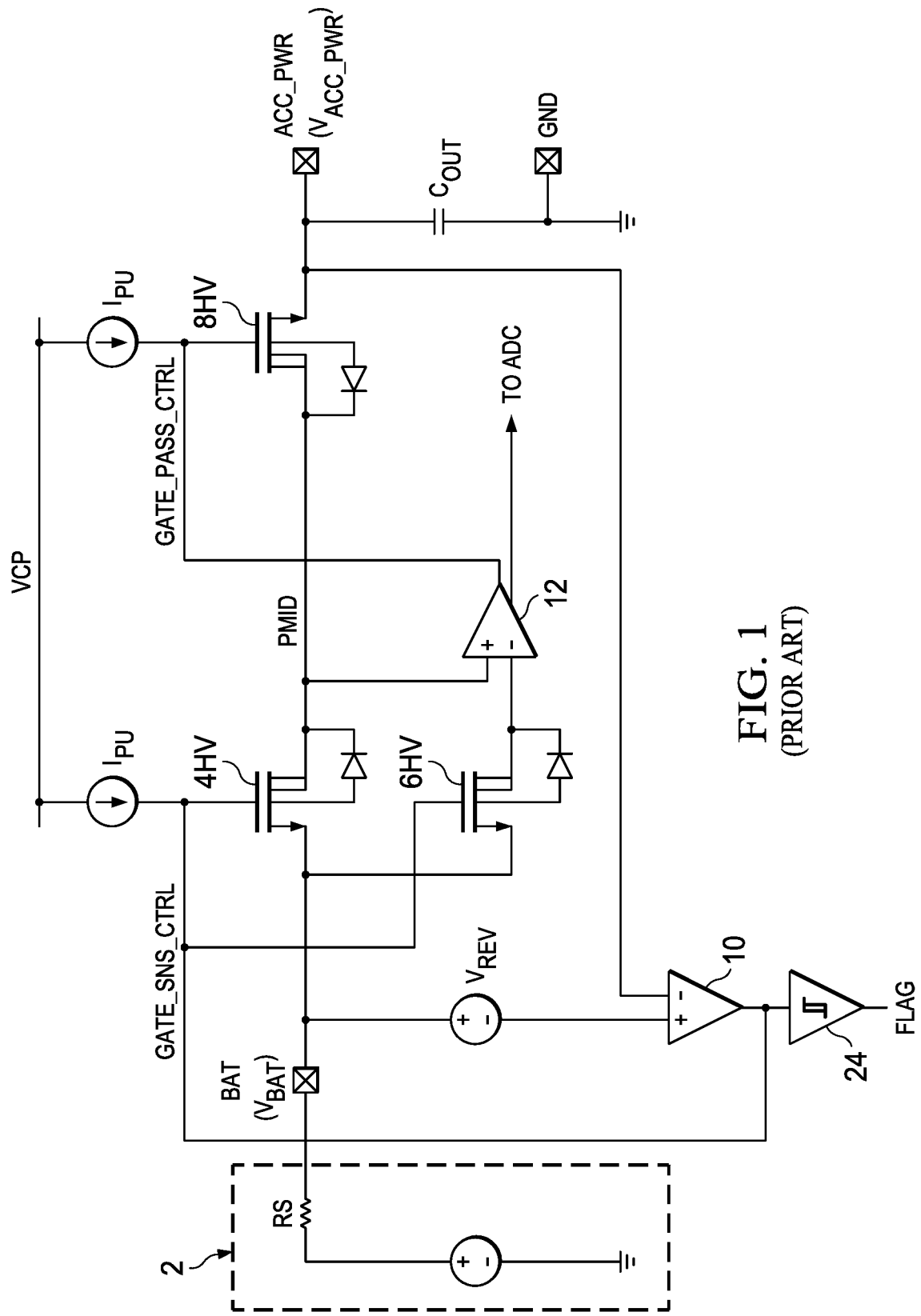
FIG. 1 is an electrical diagram, in schematic form, of a conventional power interface subsystem.

Described examples include a reverse current protection circuit, operable at low battery voltages, in a current path between a battery power port and an accessory power port in a battery-powered system. In at least one described example, the circuit achieves: improved sensing accuracy over a wide range of reverse current; and fast response in a comparator mode without sacrificing stability in a reverse current blocking mode. Further, in at least one described example, the circuit can be realized with a minimum number of high voltage-rated transistors.

In described examples, a reverse current protection circuit for a battery-powered system includes a differential amplifier that senses a voltage across a power transistor coupled between an accessory power port and a battery power port. An input stage of the differential amplifier is constructed as a cascode arrangement of low voltage transistors, with their gates biased from a bias line that replicates one of the input legs of the amplifier.

In further described examples, a reverse current protection circuit for a battery-powered system includes power transistors of varying drive strength, coupled in parallel between an accessory power port and a battery power port. One or more of the transistors is selected for operation, according to the load current demand of the accessory. A differential amplifier controls the gate voltages of the selected power transistors responsive to current between the ports as reflected in a voltage across the selected power transistors.

In more described examples, a reverse current protection circuit for a battery-powered system includes a differential amplifier that senses a voltage across a power transistor coupled between an accessory power port and a battery power port, and that is operable to control the power transistor in both a reverse-current blocking mode and in a comparator mode that allows reverse current. A diode load at the output of the differential amplifier is enabled in the reverse-current blocking mode for stability, and enabled in the comparator mode to improve the response of the circuit.

In at least one example, a power interface subsystem includes a reverse current protection circuit to control current flow between: a battery in an electronic system; and an accessory attached to the system. The circuit includes a differential amplifier based on a low voltage cascode amplifier that compares a voltage at a battery terminal with a voltage at an accessory power terminal, plus an offset of a polarity corresponding to whether the subsystem is operating in a diode mode or a comparator mode. The low voltage cascode amplifier includes a replica bias leg to bias the cascode transistors, in which voltages are clamped for protection. The circuit has a selectable output gain according to the operating mode. In some embodiments, multiple power transistors having different on-state resistances are coupled in parallel between the battery terminal and the accessory terminal, to achieve improved current sensing resolution according to the load current level.

Example embodiments described in this specification are suitable for implementation into a power interface subsystem for a battery-powered device, such as a smartphone or other portable computing or communication device, and such implementation is particularly advantageous in that context. Likewise, example embodiments are beneficially applicable to other applications, such as those in which a variety of external devices may be connected to an electronic system.

Figure 3:
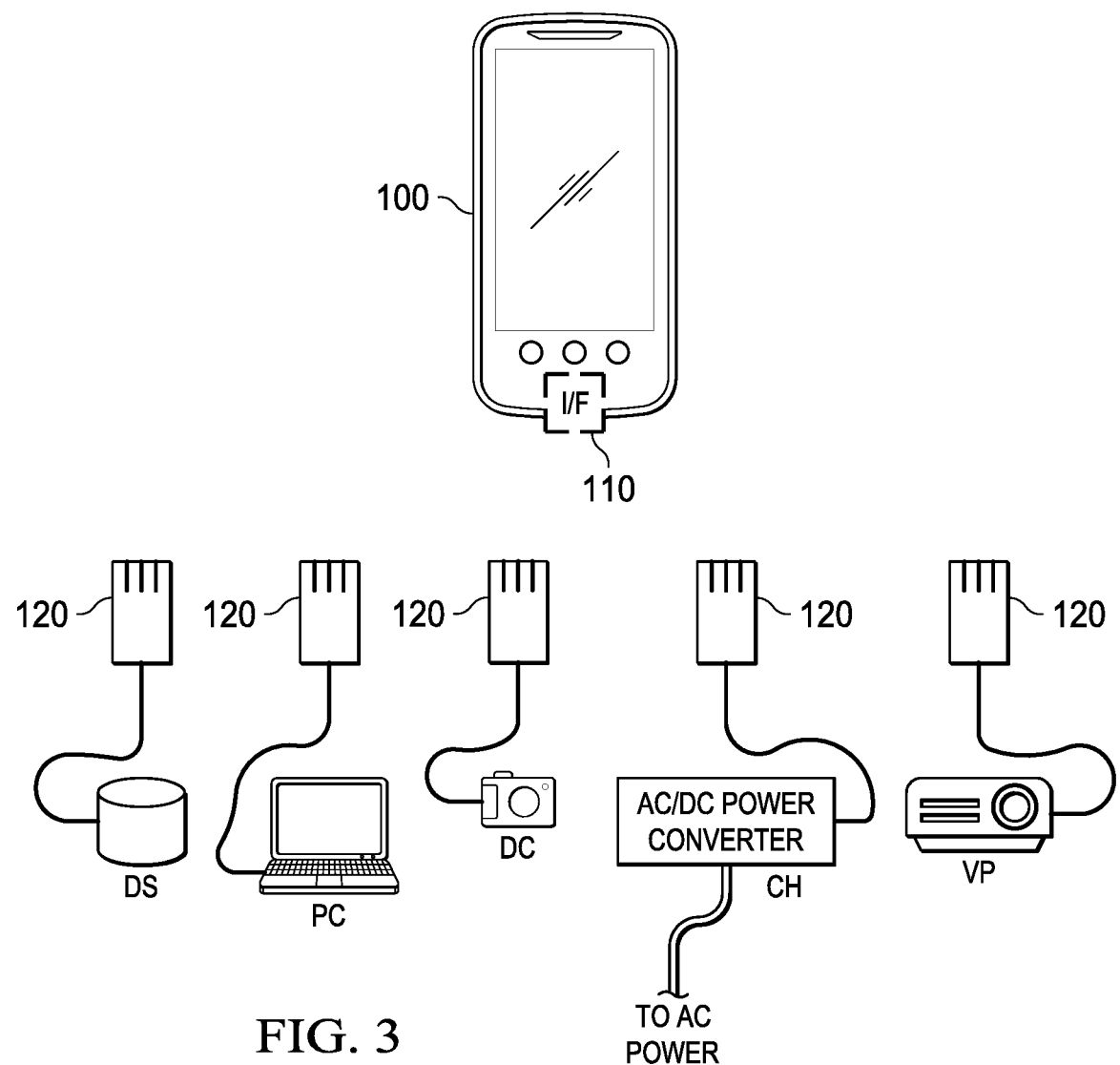
FIG. 3 is an electrical diagram, in block form, of battery-powered system with accessories in which embodiments may be implemented.

FIG. 3 illustrates an example of a system in which these embodiments may be incorporated, specifically in the context of smartphone 100. Also, these embodiments may be implemented in other types of battery-powered electronic systems. In this example, smartphone 100 includes conventional functionality for modern cellular telephone handsets, including the capability of carrying out wireless voice and data communication, video and audio recording and playback, Internet access and digital photography. Smartphone 100 in this arrangement includes interface connector 110, which may be of an industry standard (e.g., USB) or a proprietary or brand-specific (e.g., LIGHTNING interfaces for devices from Apple Inc.) type that can interface with an accessory device external to smartphone 100. Various types of accessories can be connected to the system at interfaces of these types, including external storage devices such as solid-state or magnetic disk unit DS, input and output devices including audio and video devices such as digital camera DC and video projector VP, computer systems such as notebook computer PC, and also charging devices such as AC/DC power converter CH for charging the system battery.

As indicated by FIG. 3, each of these accessories can connect to interface connector 110 of smartphone 100 through a cable and connector 120. This cable and connector 120 may be dedicated to a particular accessory, but usually is a single cable owned by the user of smartphone 100 that can plug into a number of accessories as desired. Some accessories, such as thumbdrives, may connect directly to interface connector 110 without use of a cable. In any case, interface connector 110 of smartphone 100 and connectors 120 includes one or more terminals through which data can be communicated between the connected devices and, as relevant to these embodiments, at least one power terminal through which smartphone 100 may power the accessory or through which the accessory may charge the system battery of smartphone 100. In the case of AC/DC power converter CH, only the power terminals need be active or connected at its connector 120.

Figure 4:
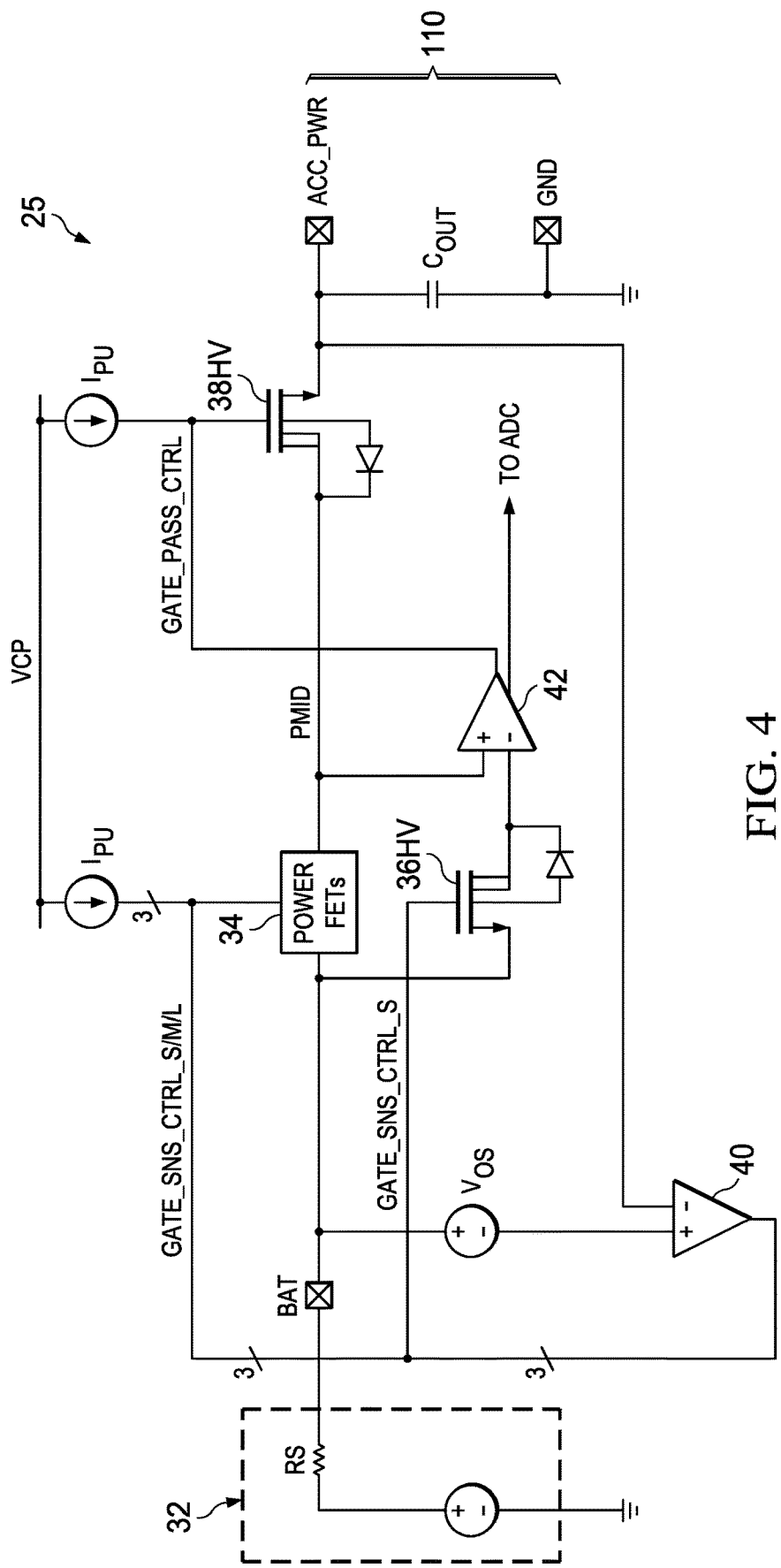
FIG. 4 is an electrical diagram, in schematic form, of a power interface subsystem according to an embodiment.

FIG. 4 illustrates the architecture of power interface subsystem 25 such as may be implemented in smartphone 100 at its interface connector 110 or in another manner in another type of battery-powered device, and constructed according to an embodiment. As shown in FIG. 4, power interface subsystem 25 is connected at power terminal ACC_PWR and ground terminal GND, which will couple to corresponding power and ground terminals of the accessory, either directly or via connector 120. In the case of functional accessories (such as external storage devices and other computing systems), data terminals (not shown) will also be provided at interface connector 110 to provide the capability of data communication.

In this architecture, smartphone 100 is powered by internal battery 32, which may be realized as a conventional rechargeable battery, such as a lithium-ion battery. Power interface subsystem 25 manages the powering of an accessory connected at power terminal ACC_PWR from battery 32, and also manages the charging of battery 32 from certain power accessories coupled at terminal ACC_PWR. As discussed above, voltage $V_{BAT}$ presented by battery 32 (e.g., of a conventional lithium-ion type) can range from below 2.5 volts when nearly discharged to about 6 volts when fully charged. In contrast, the voltage $V_{ACC\_PWR}$ presented by an accessory coupled to smartphone 100 at terminal ACC_PWR can be as high as 20 volts. According to these embodiments, power interface subsystem 25 protects smartphone 100 against excess current flow that can occur from these widely varying voltages.

More specifically, power interface subsystem 25 manages the powering of the accessory or the charging of battery 32, depending on the desired mode of operation, in either case by sensing of the voltage across terminals BAT and ACC_PWR. As shown in FIG. 4, one or more high-voltage power MOSFET transistors 34 are connected in series with high-voltage n-channel MOS transistor 38HV between terminals BAT and ACC_PWR. As described in further detail below, the gates of these power transistors 34 are controlled by corresponding gate voltages GATE_SNS_CTRL_S/M/L issued by reverse current protection circuit 40, while the gate of transistor 38HV is controlled by signal GATE_PASS_CTRL issued by current sense and limit circuit 42. As in the conventional architecture described above relative to FIG. 1, pull-up current sources apply bias currents $I_{PU}$ to the gates of each of transistors 34, 38HV in combination with corresponding signals GATE_SNS_CTRL_S/M/L and GATE_PASS_CTRL.

Similarly as the conventional subsystem of FIG. 1, n-channel high voltage MOS transistor 36HV has its source/drain path connected between terminal BAT and the negative input of current sense and limiter circuit 42, and its gate voltage corresponding to one or more of the gate voltages GATE_SNS_CTRL_S/M/L. In this example of FIG. 4, the gate of transistor 36HV receives the gate voltage GATE_SNS_CTRL_S, which is active if any of power transistors 34 is turned on. Accordingly, transistor 36HV will be on while one or more of power transistors 34 is on, during which time current sense and limiter circuit 42 compares voltage $V_{BAT}$ with the voltage at node PMID between power transistors 34 and the drain of transistor 38HV. In its general operation, current sense and limiter circuit 42 senses the polarity and magnitude of the voltage across power transistors 34, which indicates the polarity and magnitude of the current flowing between terminals BAT and ACC_PWR. The results of this comparison are communicated by current sense and limiter circuit 42 to an analog-to-digital converter (ADC) or another system control function. Also, if current sense and limiter circuit 42 detect a significantly higher voltage at terminal BAT relative to node PMID (such as can occur in the event of a short circuit at terminal ACC_PWR), then it de-asserts signal GATE_PASS_CTRL, turning off transistor 38HV to protect battery 32 against the short circuit condition.

An increasingly important factor in battery-powered systems such as smartphone 100 is the operating life that can be provided by a fully-charged battery. In addition to reduction of power consumption, the ability of circuitry in these systems to operate at low voltages as the battery discharges is an important factor in extending battery life. For example, as mentioned above, the output voltage of lithium-ion batteries can drop from about 6 volts, when fully charged, to below 2.5 volts when nearing discharge. Accordingly, power interface system 25 is preferably capable of operation at low levels of battery voltage $V_{BAT}$ (e.g., as low as 2.2 volts).

Based upon observations, conventional reverse current protection circuitry, such as circuit 10 discussed above relative to FIG. 1, requires significant power supply voltage "headroom" that limits its operation under low voltage conditions. For example, the series combination of diode-connected transistor $13_A$ and diode-connected high voltage transistor $15HV_A$ in the $V_A$ input leg of circuit 10 presents two threshold voltage drops in series. For current-day technology, these voltage drops require voltage $V_{BAT}$ to be at least about 2.7 volts to operate properly, preventing operation as the battery discharges below that level and thus limiting the useful battery life of the system. Further, based upon observations, the drain-to-source voltages of transistors $13_A$ and $15HV_A$ in the $V_A$ input leg usually do not match the drain-to-source voltages of transistors $13_A$ and $15HV_A$ in the $V_B$ input leg as a result of this conventional construction. This systematic mismatch is reflected by an offset voltage of the differential amplifier of this conventional reverse current protection circuit 10, and thus by error at its output.

According to an embodiment, a reverse current protection circuit is constructed to have a low headroom requirement, allowing operation at low battery voltages and thus extending the battery life of the system. For example, a reverse current protection circuit according to this embodiment includes a low voltage input stage capable of sensing over wide input swings, and with better matching of circuit conditions to reduce the offset voltage of its amplifier stage.

Figure 5:
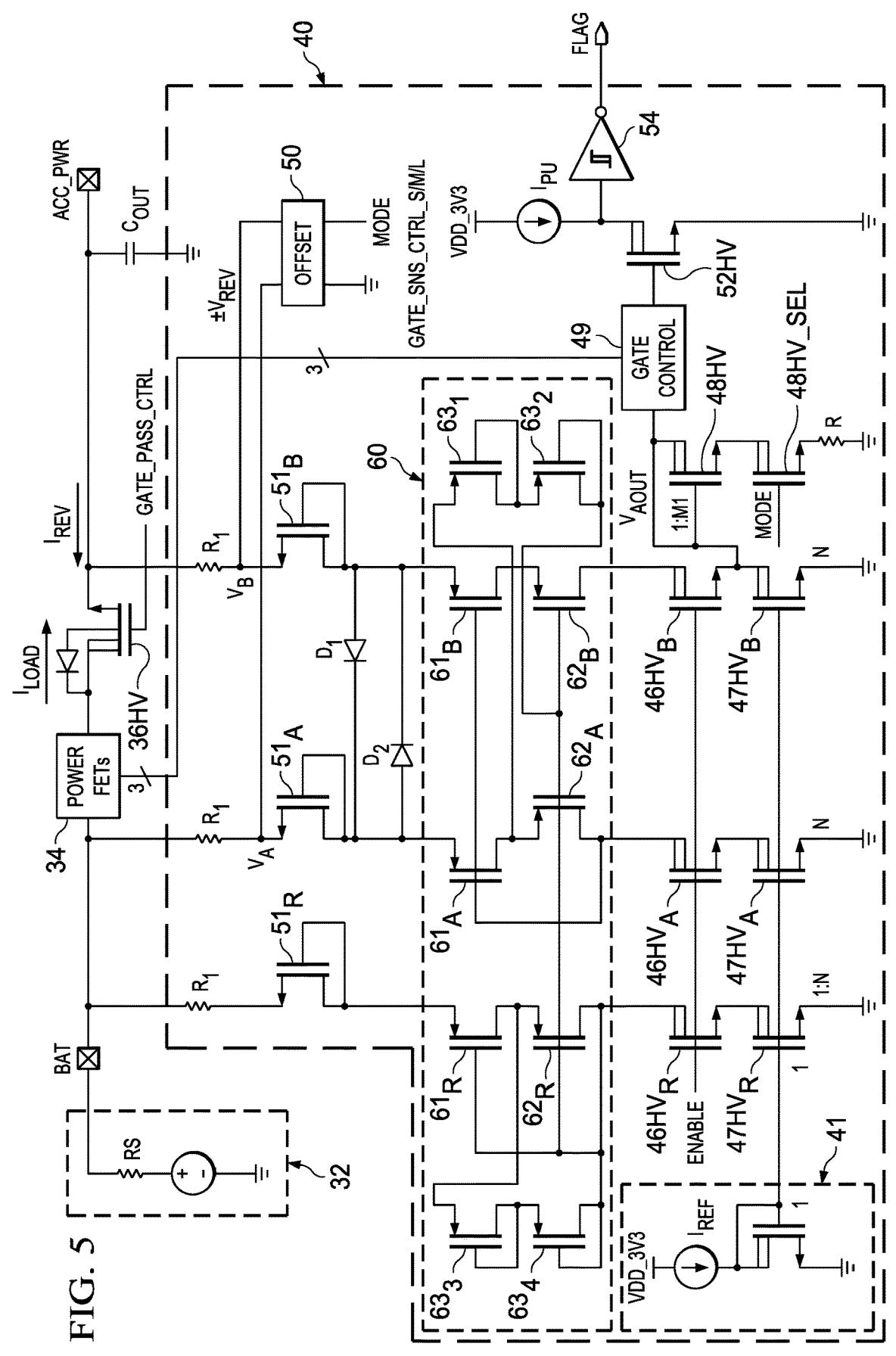

Referring to FIG. 5, reverse current protection circuit 40 includes the combination of an input stage of a differential amplifier that senses the differential voltage across terminals BAT and ACC_PWR, along with an output stage that controls power transistors 34. In a first input leg (the "$V_A$ input leg") of the differential amplifier input stage, a voltage $V_A$ is developed at the node at which a resistor $R_1$ is connected to diode-connected p-channel MOS transistor $51_A$; the opposite side of resistor $R_1$ is connected to terminal BAT. An equivalent resistor $R_1$ in the second input leg (the "$V_B$ input leg") is connected between terminal ACC_PWR and diode-connected PMOS transistor $51_B$. Programmable offset voltage source 50 pulls current from the $V_A$ node or the $V_B$ node, depending on the operating mode, to cause an offset in the voltages $V_A$ and $V_B$ corresponding to the desired forward or reverse voltage between terminals BAT and ACC_PWR to be regulated. Similarly as described above, the polarity of the voltage $V_{REV}$ applied by offset voltage source 50 is selected by mode signal MODE that indicates whether reverse current protection circuit 40 is in an ideal diode operating mode or a comparator mode. As in the circuit of FIG. 2, offset voltage source 50 may be constructed to be trimmable, such that the current it conducts from the $V_A$ or $V_B$ input leg, as the case may be (and thus the magnitude of the offset voltage $V_{REV}$), can be programmably adjusted. As before, diodes $D_1$, $D_2$ are connected across the two legs to limit the differential voltage $\Delta V=|V_A-V_B|$ to no more than a diode threshold voltage drop.

According to this embodiment, low voltage cascode amplifier 60 serves as the differential amplifier input stage of reverse current protection circuit 40. As described below, the construction and operation of cascode amplifier 60 enables operation at low levels of voltage $V_{BAT}$, while improving matching between the two input legs. An active load for the differential amplifier is provided by high-voltage NMOS transistors $47HV_A$, $47HV_B$ having their source/drain paths connected in series with the $V_A$ and $V_B$ input legs via high-voltage NMOS enable transistors $46HV_A$, $46HV_B$, respectively, and their gates controlled by voltage reference 41. The gates of enable transistors $46HV_A$, $46HV_B$ in the $V_A$ and $V_B$ input legs, respectively, are controlled in common by enable signal ENABLE generated by control circuitry elsewhere in the integrated circuit. Output voltage $V_{AOUT}$ at the drain of transistor $47HV_B$ reflects the differential voltage $\Delta V=|V_A-V_B|$. Transistors $47HV_A$, $47HV_B$ in this active load are usually scaled (1:N) relative to transistor $47HV_B$ in a conventional manner to define the range of output voltage $V_{AOUT}$.

According to the embodiment of FIG. 5, cascode amplifier 60 includes p-channel MOS transistors $61_A$ and $62_A$ with their source/drain paths connected in series between the drain of transistor $51_A$ and the drain of n-channel MOS enable transistor $46HV_A$ in the $V_A$ input leg. Similarly, the $V_B$ input leg of cascode amplifier 60 includes and p-channel MOS transistors $61_B$ and $62_B$ with their source/drain paths connected in series between the drain of transistor $51_B$ and the drain of n-channel MOS enable transistor $46HV_B$. The gates of transistors $61_A$ and $61_B$ are connected to the drain of transistor $62_A$, while the gates of transistors $62_A$, $62_B$ are biased from a replica bias leg in reverse current protection circuit 40, as described below. None of transistors $61_A$, $61_B$, $62_A$, $62_B$ in the $V_A$ and $V_B$ input legs is diode-connected, so the drain-to-source voltages of transistors $61_A$, $61_B$, $62_A$, $62_B$ in the amplifier input legs are not forced to a minimum of a diode threshold voltage drop. Accordingly, the necessary headroom of cascode amplifier 60 is reduced relative to that of the input amplifier stage of the conventional reverse current protection circuit 10 described above relative to FIG. 2.

As mentioned above, gate bias in cascode amplifier 60 is established from a replica bias leg in the circuit, specifically replicating the $V_A$ input leg in this embodiment. Referring to FIG. 5, the replica bias leg in circuit 40 includes an equivalent resistor $R_1$ connected between terminal BAT and the source of diode-connected PMOS transistor $51_R$, which is constructed to match the construction of transistor $51_A$ in the $V_A$ input leg. The drain of transistor $51_R$ in this replica bias leg is connected to the source of PMOS transistor $61_R$, which has its source/drain path connected in series with that of PMOS transistor $62_R$. High-voltage NMOS enable transistor $46HV_R$ has its drain connected to the drain of transistor $62_R$, and receives the enable signal ENABLE at its gate; high-voltage NMOS transistor $47HV_R$ in the active load of the amplifier has its source/drain path connected between the source of transistor $46HV_R$ and ground, and its gate receiving a reference voltage from reference circuit 41. Transistors $61_R$, $62_R$, $46HV_R$, and $47HV_R$ in the replica bias leg are constructed to match (e.g., with matching W/L ratios) corresponding transistors $61_A$, $62_A$, $46HV_R$, and $47HV_R$ in the $V_A$ input leg that it replicates.

A bias network establishes gate voltages in cascode amplifier 60 from the replica bias leg, according to this embodiment; in addition, this bias network clamps the voltages in cascode amplifier 60 to avoid damage from potentially high input voltages. As mentioned above, the gates of transistors $61_A$ and $61_B$ are biased at the drain of transistor $62_A$ in the $V_A$ input leg. However, the gates of transistors $62_A$, $62_B$ are biased at the drain voltage of transistor $62_R$ in the replica bias leg; the gates of transistors $61_R$ and $62_R$ in this replica bias leg are also biased at the drain voltage of transistor $62_R$. By biasing these devices from the replica bias leg, none of the transistors $61_A$, $61_B$, $62_A$, $62_B$ in cascode amplifier 60 are diode-connected, which allows the drain-to-source voltages of these devices to drop to less than a diode threshold voltage drop. This reduced voltage drop in the $V_A$ and $V_B$ input legs enables reverse current protection circuit 40 to function properly at lower levels of voltage $V_{BAT}$, and thus deeper into the discharge of battery 32.

Also, diode-connected (i.e., gate connected to drain) p-channel MOS bias transistors $63_1$ through $63_4$ operate to clamp certain voltages within cascode circuit 60 according to this embodiment. In the implementation of FIG. 5, PMOS transistors $63_1$ and $63_2$ have their source/drain paths connected in series between the drain of transistor $61_R$ and the drain of transistor $62_R$, to which the gates of transistors $61_R$, $62_R$, $62_A$ and $62_B$, are also connected. PMOS transistors $63_3$ and $63_4$ similarly have their source/drain paths connected in series between the drain of transistor $61_A$ and the gates of transistors $61_R$, $62_R$, $62_A$ and $62_B$. As a result, the gate-to-source voltages of transistors $62_A$ and $62_B$ are clamped to no more than two diode voltage drops, regardless of the voltages $V_{BAT}$ and $V_{ACC\_PWR}$. This clamping of these gate-to-source voltages protects these transistors $62_A$ and $62_B$ against excessive voltages, such as upon the attachment of a high voltage (~20 volts) accessory at terminal ACC_PWR. This high voltage protection is achieved, while also permitting transistors $61_A$, $61_B$, $62_A$, and $62_B$ in the differential amplifier input stage to be constructed as low-voltage transistors, in contrast to the conventional arrangement of FIG. 2 which requires high voltage (e.g., DMOS) transistors $15HV_A$, $15HV_B$ to tolerate the possible high voltages at terminals BAT and ACC_PWR.

Figure 2:
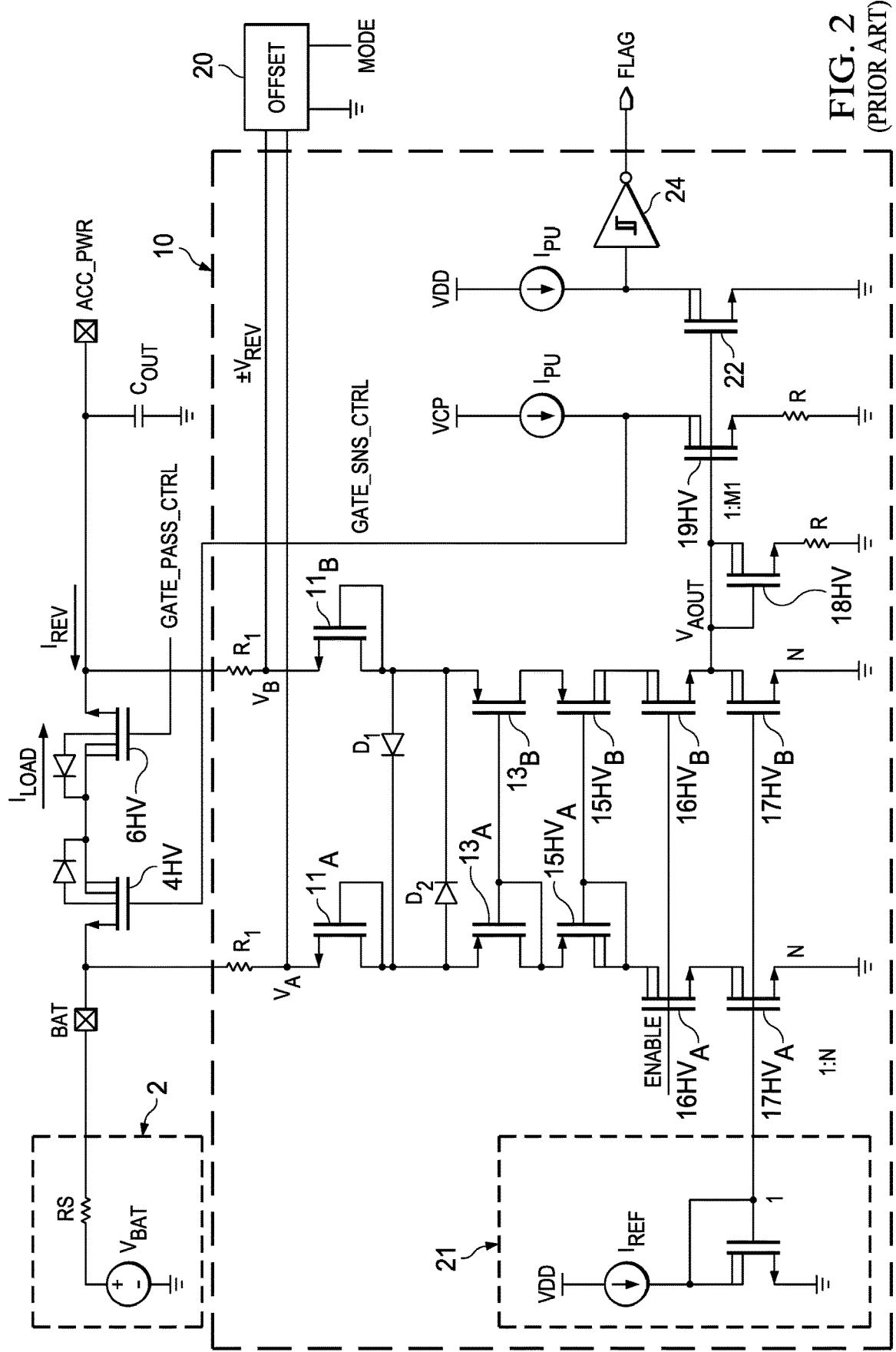
FIG. 2 is an electrical diagram, in schematic form, of a conventional reverse current protection circuit in the power interface subsystem of FIG. 1.

As mentioned above, based upon observations, the implementation of high voltage transistors in conventional protection circuits, such as transistors $15HV_A$, $15HV_B$ in circuit 10 of FIG. 2, cause mismatch between the drain-to-source voltages in one leg relative to the other, which is reflected in an increased offset voltage for the differential amplifier. According to the embodiment of FIG. 5, the clamping of gate-to-source voltages provided by this embodiment allows cascode amplifier 60 to be constructed using low voltage MOS transistors $61_A$, $61_B$, $62_A$, and $62_B$. Because these low voltage devices tend to match one another more closely than do high voltage (e.g., DMOS or DEMOS) transistors, the drain-to-source voltages of transistors $61_A$ and $62_A$ in the $V_A$ input leg more closely match corresponding drain-to-source voltages of transistors $61_B$ and $62_B$ in the $V_B$ input leg. Accordingly, the offset voltage of the differential amplifier input stage of reverse current protection circuit 40 is improved over conventional circuits, such as that described above relative to FIG. 2.

In the output stage of reverse current protection circuit 40, output voltage $V_{AOUT}$ at the drain of transistor $47HV_B$ is applied to gate control circuitry 49, which issues gate voltages GATE_SNS_CTRL_S/M/L to power transistors 34 in response. In a general sense, a low level of output voltage $V_{AOUT}$, which generally indicates that $V_A \geq V_B$, will result in one or more of power transistors 34 being turned on. For the case in which a single power transistor 34 is provided, the construction and operation of gate control circuitry 49 corresponds to that described above in connection with FIG. 2.

For purposes of stability, diode-connected high voltage NMOS transistor 48HV has its drain and gate connected at output voltage $V_{AOUT}$. This transistor 48HV may be scaled to be larger than transistor $47HV_A$, as appropriate for the desired performance. In this embodiment, the source of transistor 48HV is coupled to ground via output mode transistor 48HV_SEL and a current limiting resistor R. The gate of output mode transistor 48HV_SEL is controlled by mode signal MODE according to the particular mode of operation. As described in further detail below, output mode transistor 48HV suppresses a right-half-plane pole in the frequency response of the circuit, depending on the operating mode of the circuit.

The output stage of reverse current protection circuit 40 also includes high voltage NMOS transistor 52HV, which has its source at ground and its drain biased by a bias current $I_{PU}$ from a regulated power supply voltage, and which receives output voltage $V_{AOUT}$ from the differential amplifier stage at its gate. The output of this amplifier, at the drain of transistor 52HV, is applied to comparator 54, which generates a signal FLAG. Specifically, signal FLAG is asserted in response to voltage $V_B \geq V_A$ such that power transistors 34 are turned off, and is communicated to control circuitry elsewhere in smartphone 100 in this example.

In its general operation, reverse current protection circuit 40 is operable in two modes: an ideal diode mode in which the forward voltage from terminal BAT to terminal ACC_PWR is regulated to the offset voltage $V_{REV}$, and a comparator mode in which some level of reverse current $I_{REV}$ is allowed but in which power transistors 34 are turned off in response to excessive voltage at terminal ACC_PWR relative to terminal BAT. As in the conventional circuit described above relative to FIG. 2, this dual mode operation is controlled by the mode signal MODE, which may be issued by control circuitry elsewhere in the system. For example, the mode signal MODE controls offset voltage source 50 to effectively add reverse voltage $V_{REV}$ of one polarity or the other, depending on the operating mode, to voltage $V_{ACC\_PWR}$ to derive voltage $V_B$ applied to the corresponding leg of the differential amplifier.

In the ideal diode mode of reverse current protection circuit 40 according to this embodiment, offset voltage source 50 pulls current from the $V_A$ node to cause an offset in the voltages $V_A$ and $V_B$, such that the voltage $V_A=V_{BAT}-V_{REV}$ is compared with the voltage $V_B=V_{ACC\_PWR}$. In this mode, reverse circuit protection circuit 40 enforces a forward voltage $V_{REV}$ from terminal BAT to terminal ACC_PWR (i.e., ensures that $V_{ACC\_PWR} \leq (V_{BAT}-V_{REV})$), via the operation of its differential amplifier stage issuing output voltage $V_{AOUT}$ in response to the differential voltage between voltage $V_A=V_{BAT}$ and voltage $V_B=V_{ACC\_PWR}+V_{REV}$. Accordingly, output voltage $V_{AOUT}$ remains relatively low, so long as $V_A \geq V_V$, i.e., $V_{BAT} \geq (V_{ACC\_PWR}+V_{REV})$. Accordingly, this diode mode corresponds to the situation in which battery 32 is powering an accessory by a forward load current $I_{LOAD}$ flowing from terminal BAT to terminal ACC_PWR. If voltage $V_{ACC\_PWR}$ rises too high (i.e., above the voltage $V_{BAT}-V_{REV}$), such that reverse current $I_{REV}$ from the accessory into battery 32 is threatened, then the gate-to-source voltages of transistors $61_B$ and $62_B$ in the $V_B$ input leg will be higher than their counterparts $61_A$, $62_A$. This will result in the $V_B$ input leg conducting a higher current, which will slew output voltage $V_{AOUT}$ higher. In response to this higher output voltage $V_{AOUT}$, gate control circuitry 49 pulls down the gate voltages GATE_SNS_CTRL_S/M/L, throttling down the conduction through power transistors 34 and reducing the reverse current from terminal ACC_PWR toward terminal BAT. If this condition is severe enough, the higher output voltage $V_{AOUT}$ causes amplifier 52HV and comparator 54 to issue signal FLAG.

In the comparator mode, reverse current protection circuit 40 allows reverse current $I_{REV}$ from terminal ACC_PWR to terminal BAT, such as to permit an accessory to charge battery 32, so long as that reverse current does not become excessive. The reverse current $I_{REV}$ from terminal ACC_PWR to terminal BAT is sensed by the differential amplifier of reverse current protection circuit 40 sensing the voltage between terminals BAT and ACC_PWR. The reverse current limit permitted in this comparator mode is established by offset voltage source 50, which in this mode pulls current from the $V_B$ node to cause an offset in the voltages $V_A$ and $V_B$, such that the differential amplifier of circuit 40 compares voltage $V_A=V_{BAT}$ with the voltage $V_B=V_{ACC\_PWR}-V_{REV}$. This allows a reverse current $I_{REV}$ of a magnitude that develops a voltage of at most $V_{REV}$ across power transistors 34 and 36HV (i.e., across the on-state source/drain resistances of those devices in series). If the reverse current $I_{REV}$ from terminal ACC_PWR increases, so that the voltage across the series source/drain paths of power transistors 34 and 36HV exceeds reverse voltage $V_{REV}$, then the $V_B$ input leg of the differential amplifier conducts sufficient current to slew output voltage $V_{AOUT}$ high, causing gate control circuitry 49 to de-assert gate voltages GATE_SNS_CTRL_S/M/L to turn off power transistors 34, and issuing the fault signal FLAG. In response to the differential voltage $\Delta V=V_A-V_B$ dropping to below the permitted reverse voltage $V_{REV}$, output voltage $V_{AOUT}$ will fall, causing one or more of gate voltages GATE_SNS_CTRL_S/M/L to turn on corresponding power transistors 34 to again permit reverse current flow. Accordingly, charging of battery 32 is controlled by reverse current protection circuit 40 in this comparator mode.

As discussed above relative to the conventional circuit, the frequency response of reverse current protection circuit 40 in the ideal diode mode includes two low frequency poles, one at the gate of power transistor 34 and the other appearing at the differential amplifier output (i.e., at voltage $V_{AOUT}$). In conventional circuit 10, as noted above, output voltage $V_{AOUT}$ is coupled to ground via a diode (18HV) to render that pole non-dominant in the frequency response. However, based upon observations, this diode can significantly slow the response time of the circuit. For example, reverse current protection circuit 40 preferably operates with a fast response time in its comparator mode, in order to efficiently manage the charging of battery 32 from the accessory.

According to an embodiment, transistor 48HV_SEL is connected between the source (cathode) of diode-connected transistor 48HV and ground to provide dual-gain capability in reverse current protection circuit 40. According to this embodiment, mode signal MODE turns on output mode transistor 48HV_SEL in the ideal diode operating mode, which reduces the gain of the circuit to render the pole at $V_{AOUT}$ to be non-dominant in the frequency response to provide good stability in this mode. Conversely, in the comparator mode, mode signal MODE is de-asserted, which turns off output mode transistor 48HV_SEL and removes diode 48HV from affecting the gain. Accordingly, reverse current protection circuit 40 operates at a higher gain in this comparator mode, and exhibits a significantly faster response time. Precise sensing of reverse current $I_{REV}$ is achieved, minimizing the flow of reverse current from the attached accessory.

Based upon observations, conventional power interface subsystems, such as that described above relative to FIG. 2, tend to have low sensing accuracy over wide ranges of load current. Rather, the low on-state source/drain resistance presented by the relatively large (in terms of channel width) power transistors between the battery and the external accessory limits the ability of the conventional circuit to accurately sense low current levels. Unfortunately, the wide variation of accessories that may be attached to the system present load currents that can range from milliamperes to amperes. Accordingly, precise sensing of reverse current levels cannot be maintained by conventional reverse current protection circuits.

According to another embodiment, multiple power transistors 34 are provided in reverse current protection circuit 40 to provide accurate sensing at different ranges of load current, as will now be described relative to FIGS. 6A and 6B in combination with FIG. 5. In this embodiment, power transistors 34 are realized as multiple high voltage NMOS transistors, of varying sizes, with their source/drain paths connected in parallel with one another in the current path between terminals BAT and ACC_PWR, and their gates receiving separate individual gate enable signals. As shown in FIG. 5, power transistors 34 are connected between terminal BAT and the drain of transistor 36HV, and receive gate voltages GATE_SNS_CTRL_S/M/L from gate control circuitry 49 at the output of reverse current protection circuit 40.

Figure 6A:
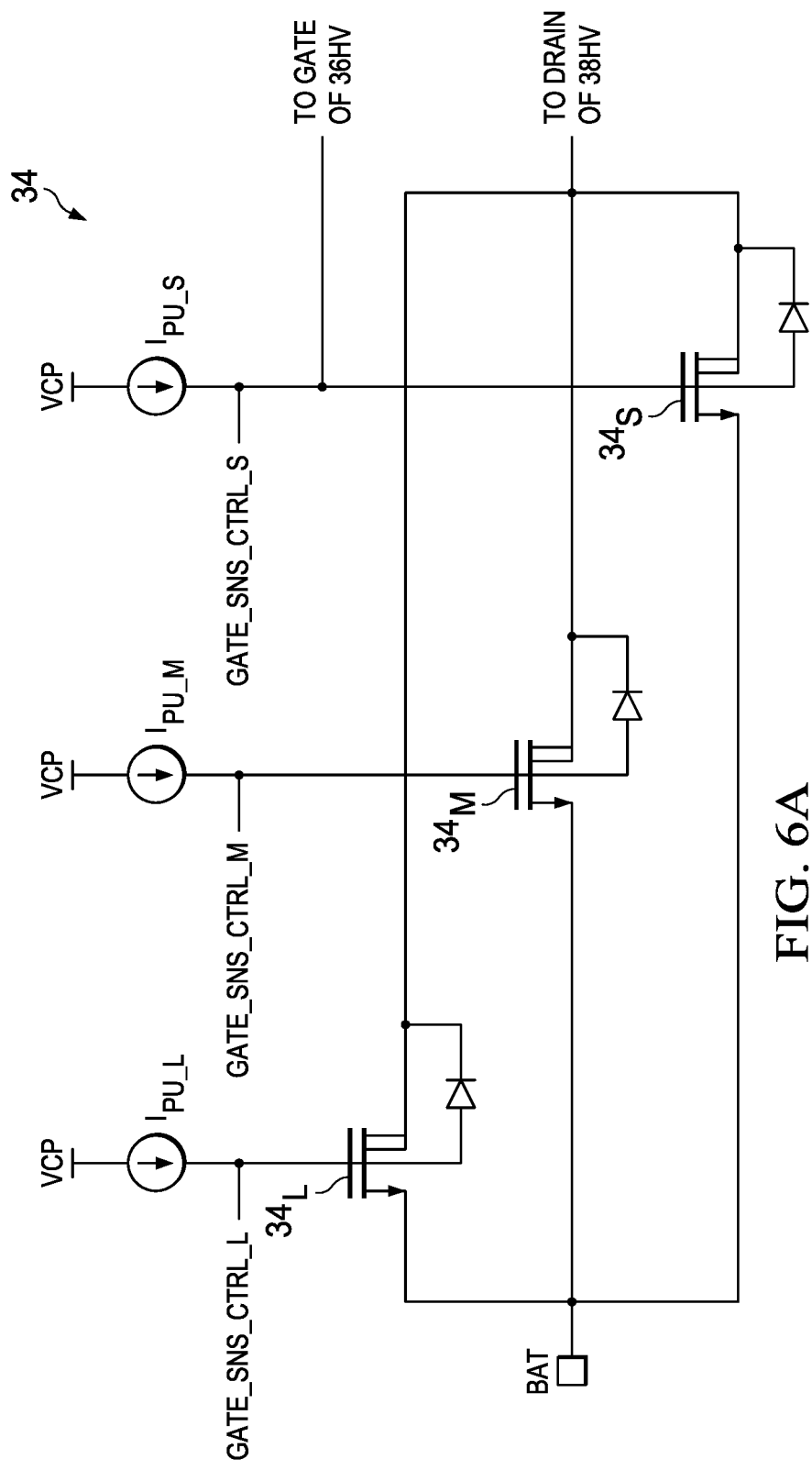
FIG. 6A is an electrical diagram, in schematic form, of the arrangement of power transistors in the power interface subsystem according to an embodiment.

FIG. 6A illustrates an example of multiple power transistors 34 connected in parallel according to this embodiment. Specifically, three high-voltage NMOS transistors $34_S$, $34_M$, $34_L$ are provided in this embodiment, each with its source connected to terminal BAT and its drain coupled to the drain of power transistor 36HV. Three power transistors 34 are shown in this example, but more or fewer such devices may alternatively be used. As described above, these power transistors $34_S$, $34_M$, $34_L$ are preferably constructed using DMOS or another suitable technology to tolerate high drain-to-source voltages as may occur upon the connection of an accessory at terminal ACC_PWR. The gates of power transistors $34_S$, $34_M$, $34_L$ receive gate voltages GATE_SNS_CTRL_S, GATE_SNS_CTRL_M, GATE_SNS_CTRL_L, respectively, from gate control circuitry 49, as will be described below. Pull-up currents $I_{PU\_S}$, $I_{PU\_M}$, $I_{PU\_L}$ are applied to the gate of power transistor $34_S$, $34_M$, $34_L$, respectively, for proper bias. In this embodiment, bias currents $I_{PU0}$, $I_{PU1}$, $I_{PU2}$ are driven by a charge pump that generates a voltage VCP sufficiently high that power transistors 34 do not exhibit a threshold voltage drop. In this embodiment, power transistors $34_S$, $34_M$, $34_L$ have varying sizes relative to one another, from the standpoint of channel width to channel length (W/L) ratio. In this example, power transistor $34_S$ has a smaller W/L ratio than power transistor $34_M$, which in turn has a smaller W/L ratio than power transistor $34_L$. Usually, these variations in W/L ratio are realized by varying the width of the MOS transistor channel from one transistor to the next, while maintaining the same channel length to otherwise maintain good device matching. The on-state source/drain resistance of an MOS transistor varies inversely with the W/L ratio of the device, such that larger transistors will exhibit less resistance in the on state than will smaller transistors. Accordingly, the on-state resistance of power transistor $34_S$ will be higher than that of power transistor $34_M$, which in turn will have a higher resistance than power transistor $34_L$. The particular W/L ratios and corresponding resistances of power transistors $34_S$, $34_M$, $34_L$ relative to one another, and the number of those transistors, will depend on the sensitivity range desired for a particular application of power interface subsystem 25. The power transistors $34_S$, $34_M$, $34_L$ have appropriate relative device sizes that are suitable for those applications.

Figure 6B:
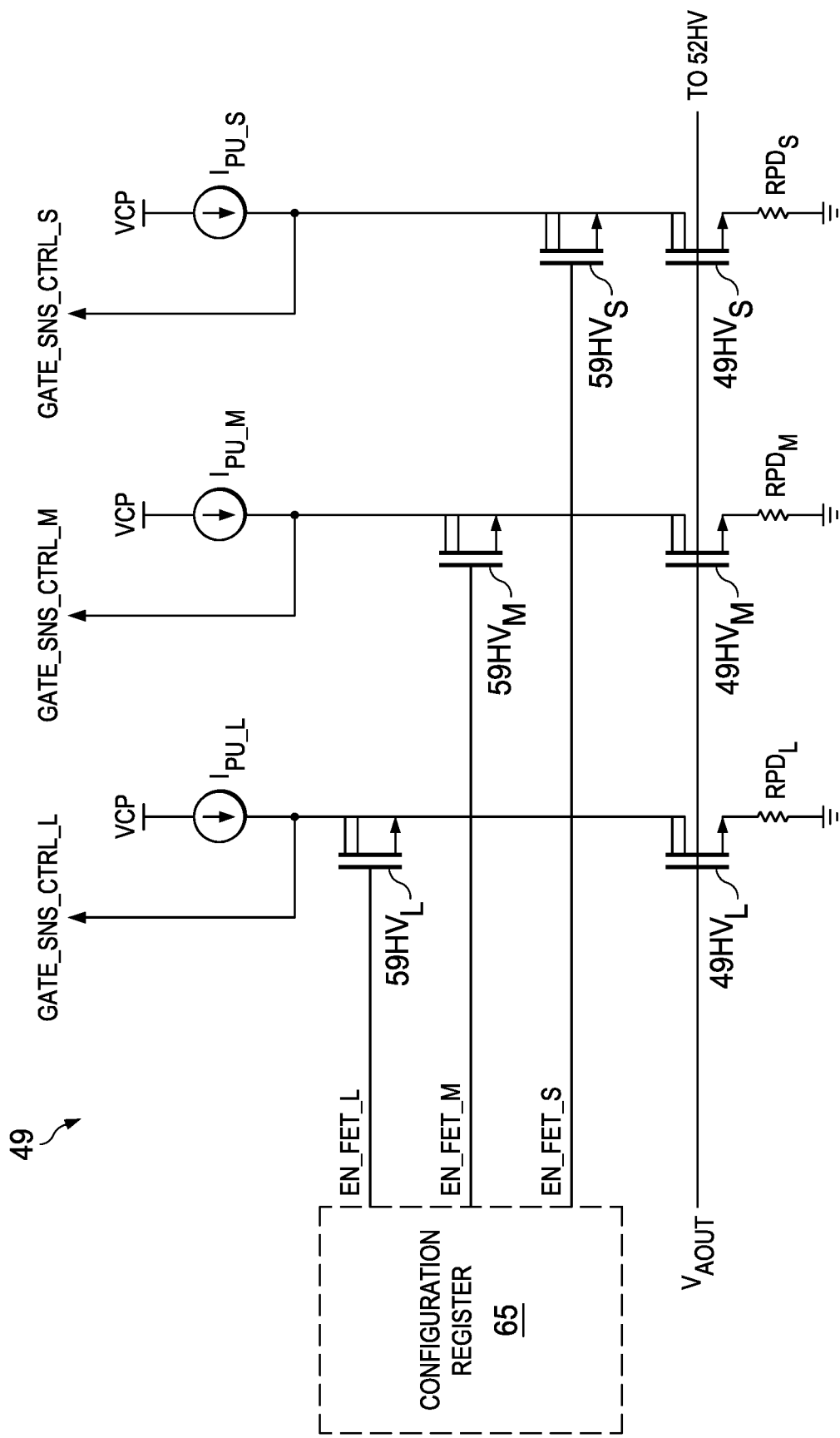
FIG. 6B is an electrical diagram, in schematic form, of gate control circuitry for the power transistors of FIG. 5a according to that embodiment.

FIG. 6B illustrates an example of gate control circuitry 49, which generates gate voltages GATE_SNS_CTRL_S, GATE_SNS_CTRL_M, GATE_SNS_CTRL_L for power transistors $34_S$, $34_M$, $34_L$, respectively. In this embodiment, multiple high voltage NMOS transistors $49HV_S$, $49HV_M$, $49HV_L$ have their gates connected to receive output voltage $V_{AOUT}$ from the drain of transistor $47HV_B$ (FIG. 5). Each of transistors $49HV_S$, $49HV_M$, $49HV_L$ has its source coupled to ground by a corresponding resistor $RPD_S$, $RPD_M$, $RPD_L$, respectively, and its drain connected to the source-drain path of a corresponding high voltage NMOS enable transistor $59HV_0$, $59HV_1$, $59HV_2$, respectively. Bias currents $I_{PU\_S}$, $I_{PU\_M}$, $I_{PU\_L}$ at the gates of power transistors $34_S$, $34_M$, $34_L$ (FIG. 6A) are also received at the drains of enable transistors $59HV_0$, $59HV_1$, $59HV_2$, respectively, from which gate voltages GATE_SNS_CTRL_S, GATE_SNS_CTRL_M, GATE_SNS_CTRL_L are respectively driven. Transistors $49HV_S$, $49HV_M$, $49HV_L$ and their source resistors $RPD_S$, $RPD_M$, $RPD_L$ may be scaled relative to one another and to the relative magnitudes of bias currents $I_{PU\_S}$, $I_{PU\_M}$, $I_{PU\_L}$.

As mentioned above, power transistors $34_S$, $34_M$, $34_L$ are differently sized from one another to present varying on-state source/drain resistances. According to this embodiment, gate control circuitry 49 can enable a subset of these power transistors $34_S$, $34_M$, $34_L$ to select the sensitivity with which the current between terminals BAT and ACC_PWR is sensed by reverse current protection circuit. Gate control circuitry 49 performs this selection by enable signals EN_FET_S, EN_FET_M, and EN_FET_L that selectively turn on or off series transistors $59HV_0$, $59HV_1$, $59HV_2$, respectively; these enable signals EN_FET_S/M/L may also control the corresponding bias current to turn off the corresponding power transistor 34 when de-selected. Conversely, assertion of an enable signal, e.g., enable signal EN_FET_M, will enable its bias current $I_{PU\_M}$ and turn on its enable transistor $59HV_1$, allowing its corresponding transistor $49HV_M$ to control the state of gate enable signal GATE_SNS_CTRL_M, and thus the state of that power transistor $34_M$, in response to the output voltage $V_{AOUT}$. As described above, a high level of output voltage $V_{AOUT}$ in response to the voltages at terminals BAT, ACC_PWR, will turn on the enabled ones of transistors $49HV_S$, $49HV_M$, $49HV_L$, which in turn will pull the corresponding gate voltages GATE_SNS_CTRL_S/M/L toward ground, and reduce the gate drive of power transistors $34_S$, $34_M$, $34_L$, respectively.

As shown in FIG. 6B, the states of enable signals EN_FET_S/M/L are determined by the contents of configuration register 65 according to this embodiment. The contents of configuration register 65 may be set by the system user, either by programming the desired state or automatically, such as based on identification of the accessory attached at power terminal ACC_PWR and its expected current load. For example, if the attached accessory will draw a relatively light current load, configuration register 65 may be set to assert only enable signal EN_FET_S, so that only the smallest power transistor $34_S$ is turned on during normal operation (and is responsive to output voltage $V_{AOUT}$ through operation of transistor $49HV_S$); power transistors $34_M$ and $34_L$ will be held off as a result. In this light load condition, the higher on-state resistance of transistor $34_S$ will provide maximum precision in the sensing of current between terminals BAT and ACC_PWR, in either the ideal diode mode (forward current) or the comparator mode (reverse current). For medium load conditions, configuration register 65 may be set so that enable signals EN_FET_S and EN_FET_M are asserted and enable signal EN_FET_L is de-asserted; in this case, power transistors $34_S$ and $34_M$, in parallel, will be turned on during operation, and the largest power transistor $34_L$ will remain off. The level of output voltage $V_{AOUT}$ will operate to turn off transistors $49HV_S$ and $49HV_M$ and thus power transistors $34_S$, $34_M$, in the event of a fault, as described above. In this condition, a medium level of on-state resistance is provided, such that the current sensing precision will be suitable for a medium level of forward or reverse current, while also providing adequate conduction for that load current. For the highest load currents, configuration register 65 may be set to assert all three enable signals EN_FET_S, EN_FET_M, and EN_FET_L, turning on all three power transistors $34_S$, $34_M$, $34_L$ in parallel, and presenting the lowest series resistance to the current path between terminals BAT and ACC_PWR. At this large load current, this lowest series resistance will still allow adequate sensing precision and the appropriate conduction. All three of transistors $49HV_S$, $49HV_M$, $49HV_L$ will respond to output voltage $V_{AOUT}$ in this case, turning off power transistors $34_S$, $34_M$, $34_L$ in the event of a fault.

Configuration register 65 may assert enable signals EN_FET_S/M/L in other combinations as may be desired for a particular application. For example, the medium current sensing precision may be selected by asserting only enable signal EN_FET_M and not the others, if desired.

As discussed above, this embodiment provides the ability to more accurately and precisely sense the forward and reverse current between the system battery and an attached accessory, even over the wide range of load currents that can be presented by the many varied accessories now available for modern smartphones and other battery-powered electronic systems. This accurate precision is obtained while still maintaining the necessary performance by providing sufficient forward drive current and minimizing reverse current.

Accordingly, the various embodiments described above provide important advantages in the construction and functionality of a power interface subsystem for a battery-powered electronic system, such as a modern smartphone, tablet computer and notebook computer. The useful battery life of such systems is extended by the ability of an embodiment to operate at significantly lower headroom, without the need of high voltage devices in the amplifier stage of the reverse current protection circuit while still tolerating high accessory voltages. Improved performance due to better matching of voltages in the amplifier stage is also attained. Dual gain performance is realized according to another embodiment, such that stability is maintained when operating in a reverse current blocking mode in combination with improved response times when operating in a comparator mode in which reverse current into the battery is permitted. Also, the current sensing precision is achieved over a wide range of possible load currents according to an embodiment.

The above description presents the various embodiments as composed of MOS transistors of particular channel conductivity types (n-channel and p-channel). Alternatively, these circuits may be realized using transistors of the opposite channel conductivity types, with the bias polarity etc. reversed as appropriate. Further in the alternative, these circuits may be realized in whole or in part using bipolar transistors, in which case the transistor conduction path corresponds to a collector-emitter path rather than a source/drain path, and the transistor control terminal corresponds to a base rather than a gate.

Modifications are possible in the described embodiments, and other embodiments are possible, within the scope of the claims.

What is claimed is:

1. A system comprising:
   first and second transistors coupled in series; and
   a reverse current protection circuit including:
      a differential amplifier including:
         first, second, and third load devices;
         a first input leg coupled between a terminal of the first transistor and the first load device and including third and fourth transistors coupled in series;
         a second input leg coupled between a terminal of the second transistor and the second load device and including fifth and sixth transistors coupled in series, wherein gates of the third and fifth transistors are coupled to a terminal of the fourth transistor; and
         a bias leg coupled between the terminal of the first transistor and the third load device and including seventh and eighth transistors coupled in series, wherein gates of the seventh and eighth transistors and gates of the fourth and sixth transistors are coupled to a terminal of the eighth transistor;
      an offset voltage source coupled to the first and second input legs and configured to cause a voltage offset of a selected polarity between the first and second input legs; and
      gate control circuitry coupled between a terminal of the second load device and a gate of the first transistor.

2. The system of claim 1, wherein the reverse current protection circuit further includes:
   a clamp circuit coupled to the first and second input legs and to the bias leg and configured to clamp a voltage differential between a terminal of the third transistor and the gates of the fourth and sixth transistors and configured to clamp a voltage differential between a terminal of the eighth transistor and the gates of the fourth and sixth transistors.

3. The system of claim 2, wherein the clamp circuit includes:
   first and second diode-connected transistors coupled in series between the terminal of the third transistor and the gates of the fourth and sixth transistors; and
   third and fourth diode-connected transistors coupled in series between the terminal of the eighth transistor and the gates of the fourth and sixth transistors.

4. The system of claim 3, wherein the first transistor is a high-voltage metal-oxide-semiconductor (MOS) transistor, and the fourth and sixth transistors are low-voltage MOS transistors.

5. The system of claim 1, wherein the reverse current protection circuit further includes:
   a first resistor connected in series between the terminal of the first transistor and the first input leg;
   a second resistor connected in series between the terminal of the second transistor and the second input leg; and
   a third resistor connected in series between the terminal of the first transistor and the bias leg;
   wherein the offset voltage source is coupled to terminals of the first second resistors.

6. The system of claim 1, further comprising:
   control circuitry coupled to the offset voltage source and configured to cause the voltage offset to have a first polarity in a first operating mode and a second polarity in a second operating mode.

7. The system of claim 6, further comprising:
   an output diode coupled to the terminal of the second load device and to the gate control circuitry; and
   an output transistor coupled in series with the output diode and having a gate coupled to the control circuitry;
   wherein the control circuitry is configured to turn on the output transistor durinq the first operating mode and turn off the output transistor during the second operating mode.

8. The system of claim 7, further comprising a ninth transistor coupled in parallel with the first transistor, the ninth transistor having a gate coupled to the gate control circuitry and having a different on-state resistance than the first transistor;
   wherein the gate control circuitry is configured to:
      apply a first gate voltage, to a selected one of the first and ninth transistors, which is responsive to a voltage at the terminal of the second load device; and
      apply a second gate voltage to an unselected one of the first and ninth transistors.

9. The system of claim 1, further comprising a ninth transistor coupled in parallel with the first transistor, the ninth transistor having a gate coupled to the gate control circuitry and having a different on-state resistance than the first transistor;
   wherein the gate control circuitry is configured to:
      apply a first gate voltage, to a selected one of the first and ninth transistors, which is responsive to a voltage at the terminal of the second load device; and
      apply a second gate voltage to an unselected one of the first and ninth transistors.

10. The system of claim 1, wherein the terminals of the first and second transistors are first terminals, the system further comprising:
    a current sense and limit circuit having a first input coupled to the first terminal of the first transistor, a second input coupled to second terminals of the first and second transistors, and an output coupled to a gate of the second transistor, wherein the current and sense limit circuit is configured to control a state of the second transistor responsive to a voltage at the first terminal of the first transistor and a voltage at the second terminals of the first and second transistors.

11. A system comprising:
first and second transistors coupled in series; and
a reverse current protection circuit including:
  a differential amplifier having a first input coupled to a terminal of the first transistor, a second input coupled to a terminal of the second transistor, and an output;
  an offset voltage source coupled to the first and second inputs and configured to cause a voltage offset of a selected polarity at the first and second inputs, the voltage offset having a first polarity in a first operating mode and a second polarity in a second operating mode;
  control circuitry coupled between the output of the differential amplifier and a control terminal of the first transistor;
  an output diode coupled to the output of the differential amplifier and to the control circuitry; and
  an output transistor coupled in series with the output diode.

12. The system of claim 11, wherein the control circuitry is first control circuitry, the system further comprising:
second control circuitry coupled to the offset voltage source and to a control terminal of the output transistor and configured to indicate an active one of the first and second operating modes.

13. The system of claim 12, wherein
the first, second, and output transistors are metal-oxide-semiconductor (MOS) transistor.

14. The system of claim 13, wherein the output diode includes a diode-connected MOS transistor.

15. The system of claim 11, further comprising a third transistor coupled in parallel with the first transistor, the third transistor having a control terminal coupled to the control circuitry and having a different on-state resistance than the first transistor;
wherein the control circuitry is configured to:
  apply a first control level, to the control terminal of a selected one of the first and third transistors, which is responsive to a voltage at the output of the differential amplifier; and
  apply a second control level to the control terminal of an unselected one of the first and third transistors.

16. A system comprising:
first and second transistors coupled in series;
a third transistor coupled in parallel with the first transistor, wherein the first and third transistors have different on-state resistances; and
a reverse current protection circuit including:
  a differential amplifier having a first input coupled to a terminal of the first transistor, a second input coupled to a terminal of the second transistor, and an output;
  an offset voltage source coupled to the first and second inputs and configured to cause a voltage offset of a selected polarity at the first and second inputs, the voltage offset having a first polarity in a first operating mode and a second polarity in a second operating mode; and
  control circuitry coupled between the output of the differential amplifier and control terminals of the first and third transistors.

17. The system of claim 16, wherein the first and third transistors are metal-oxide-semiconductor (MOS) transistors.

18. The system of claim 17, wherein the first and third transistors have different channel width to channel length ratios.

19. The system of claim 1, wherein:
the seventh transistor has a same width to length ratio as the third transistor;
the eighth transistor has a same width to length ratio as the fourth transistor; and
the third load device has a same width to length as the first load device.

20. The system of claim 1, wherein none of the third through sixth transistors are diode-connected.

* * * * *